(12) United States Patent
Arita et al.

(10) Patent No.: US 7,138,034 B2
(45) Date of Patent: *Nov. 21, 2006

(54) ELECTRODE MEMBER USED IN A PLASMA TREATING APPARATUS

(75) Inventors: Kiyoshi Arita, Fukuoka (JP); Tetsuhiro Iwai, Kasuga (JP); Hiroshi Haji, Chikushino (JP); Shoji Sakemi, Ogoori (JP); Taiji Matano, Kitakyushu (JP); Nobuhiro Satou, Kitakyushu (JP)

(73) Assignees: Matsushita Electric Industrial Co., Ltd., Osaka (JP); Krosaki Harima Corporation, Fukuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/176,804

(22) Filed: Jun. 21, 2002

(65) Prior Publication Data

US 2002/0195202 A1    Dec. 26, 2002

(30) Foreign Application Priority Data

Jun. 25, 2001    (JP)    ........................ P. 2001-190891

(51) Int. Cl.
*H01L 21/00*    (2006.01)
(52) U.S. Cl. .............................. 156/345.47; 156/345.43
(58) Field of Classification Search ........... 156/345.47, 156/345.43, 345.44, 345.45, 345.46; 118/723 E
See application file for complete search history.

(56) References Cited

U.S. PATENT DOCUMENTS

| | | | | |
|---|---|---|---|---|
| 4,367,114 A | * | 1/1983 | Steinberg et al. | 156/345.34 |
| 4,491,496 A | * | 1/1985 | Laporte et al. | 156/345.47 |
| 4,664,858 A | | 5/1987 | Kido et al. | |
| 5,693,182 A | | 12/1997 | Mathuni | |
| 5,881,353 A | * | 3/1999 | Kamigata et al. | 419/2 |
| 5,928,810 A | * | 7/1999 | Bernard et al. | 429/235 |
| 5,968,377 A | | 10/1999 | Yuasa et al. | |
| 5,999,589 A | | 12/1999 | Chiba et al. | |
| 6,086,710 A | | 7/2000 | Miyashita et al. | |
| 6,099,965 A | * | 8/2000 | Tennent et al. | 428/408 |
| 6,165,274 A | * | 12/2000 | Akiyama et al. | 118/724 |
| 6,239,036 B1 | | 5/2001 | Arita et al. | |

FOREIGN PATENT DOCUMENTS

| | | |
|---|---|---|
| AT | 386 316 B | 8/1988 |
| JP | 57-185982 | 11/1982 |
| JP | 58-6134 | 1/1983 |

(Continued)

OTHER PUBLICATIONS

Amended claims of U.S. Appl. No. 10/178, 444 dated on Jun. 9, 2005 used for the provisional Double Patenting Rejection.*

*Primary Examiner*—Parviz Hassanzadeh
*Assistant Examiner*—Michelle Crowell
(74) *Attorney, Agent, or Firm*—Pearne & Gordon LLP

(57) ABSTRACT

In a plasma treating apparatus, a ceramic porous substance having a three-dimensional network structure in which a frame portion formed of ceramic containing alumina is provided continuously like a three-dimensional network is used for the material of an electrode member for the plasma treating apparatus to be attached to the front surface of a gas supplying port of an electrode for plasma generation, and a gas for plasma generation is caused to pass through a hole portion formed irregularly in the three-dimensional network structure. Consequently, the distribution of the gas to be supplied is made uniform to prevent an abnormal discharge so that uniform etching having no variation can be carried out.

8 Claims, 5 Drawing Sheets

FOREIGN PATENT DOCUMENTS

| | | | |
|---|---|---|---|
| JP | 58006134 A | * | 1/1983 |
| JP | 59-111967 | | 6/1984 |
| JP | 60-171220 | | 9/1985 |
| JP | 61-278144 | | 12/1986 |
| JP | 63-282179 | | 11/1988 |
| JP | 03101126 A | | 4/1991 |
| JP | 04037124 A | * | 2/1992 |
| JP | 06-002149 | | 1/1994 |
| JP | 06002149 | * | 11/1994 |
| JP | 07097690 A | * | 4/1995 |
| JP | 08209349 A | * | 8/1996 |
| JP | 11-283973 | | 10/1999 |
| JP | 2000173995 A | * | 6/2000 |
| WO | 96/31997 | | 10/1996 |

* cited by examiner

ELECTRODE MEMBER USED IN A PLASMA TREATING APPARATUS

BACKGROUND OF THE INVENTION

The present invention relates to an electrode member for a plasma treating apparatus to be attached to the front surface of the gas supplying port of an electrode for plasma generation in the plasma treating apparatus. Further, the present invention relates to a plasma treating apparatus and plasma treating method using the above-mentioned electrode member.

As an apparatus for surface finishing an electronic component such as a substrate or a semiconductor device, a plasma treating apparatus has been known. The plasma treating apparatus serves to generate plasma under a vacuum atmosphere and to carry out a treatment such as etching over the surface of an object to be treated physically and chemically by the plasma. The plasma is generated by applying a high frequency voltage to an electrode in a sealed treatment chamber. A gas for plasma generation having a predetermined pressure (hereinafter referred to as a "gas") is supplied in the treatment chamber.

In such a plasma treatment, in some cases it is desirable that a high density plasma should be generated depending on the purposes of the treatment. In a plasma treating apparatus for carrying out plasma etching on a silicon substrate, such as a semiconductor wafer, a method of spraying and supplying a gas having a comparatively high pressure onto the surface of a silicon wafer is used in order to enhance the treatment efficiency.

For such a gas supplying method, a conventional method is known in which a gas supplying port is formed on an upper electrode provided opposite to a lower electrode holding a silicon wafer. The upper electrode serves as a discharge electrode plate and a gas introducing plate. In this case, the discharge electrode plate has a large number of fine gas supplying holes and is attached to the upper electrode, thereby uniformly supplying a gas to the surface of a silicon wafer.

In the case in which the discharge electrode plate is used, however, there are the following problems. In the method of injecting and supplying a gas from a gas supplying hole, the uniform distribution of the gas to be supplied is restricted and the amount of the gas to be sprayed onto the surface of a silicon wafer is not uniform between a portion provided under the supplying hole and other portions.

For this reason, an abnormal discharge in which plasma is convergently generated in the vicinity of the supplying hole is apt to be induced and various drawbacks are caused by the abnormal discharge. More specifically, etching is convergently carried out in a portion in which the abnormal discharge is generated. Therefore, there is a drawback in that the quality of etching is affected, for example, a silicon wafer is damaged or an etching result has a variation. In addition, there is a drawback that a discharge electrode plate provided with the gas supplying hole is worn by the plasma, depending on the material of the discharge electrode plate.

Moreover, porous ceramic having crystal grains, having a diameter of about 10 μm to 50 μm, aggregated and sintered has been tried to be used as a discharge electrode plate. However, since the discharge electrode plate is easily broken due to heat shock caused by the heat of plasma, it cannot be used as a discharge electrode to be directly exposed to the plasma.

SUMMARY OF THE INVENTION

A first aspect of the invention is directed to an electrode member for a plasma treating apparatus which includes a plasma generation electrode having the gas supplying port for supplying a gas for plasma generation to a treatment chamber, the electrode member to be attached to a front surface of the gas supplying port, wherein the electrode member having a three-dimensional network structure and a clearance of the three-dimensional network structure constituting a plurality of irregular paths for causing the gas for plasma generation supplied from the gas supplying port to pass therethrough, a size of the clearance is set in a range from 100 μm to 300.

According to the second aspect of the invention, a plasma treating apparatus comprises: a treatment chamber; a first electrode having a holding portion for holding a work in the treatment chamber; a second electrode provided in a position opposed to the first electrode and having a gas supplying port for supplying a gas for plasma generation to the treatment chamber; a pressure control portion for reducing a pressure in the treatment chamber; a gas supplying portion for supplying the gas for plasma generation to the treatment chamber through the gas supplying port; a high frequency generating portion for applying a high frequency voltage between the first electrode and the second electrode; and an electrode member to be attached to a front surface of the gas supplying port, where in the electrode member has a three-dimensional network structure and a clearance of the three-dimensional network structure constitutes a plurality of irregular paths for causing the gas for plasma generation to pass therethrough.

According to the third aspect of the invention, a plasma treating method in a plasma treating apparatus comprising a treatment chamber, a first electrode having a holding portion for holding a work in the treatment chamber, a second electrode provided in a position opposed to the first electrode and having a gas supplying port for supplying a gas for plasma generation to the treatment chamber, a pressure control portion for reducing a pressure in the treatment chamber, a gas supplying portion for supplying the gas for plasma generation to the treatment chamber through the gas supplying port, a high frequency generating portion for applying a high frequency voltage between the first electrode and the second electrode, and an electrode member to be attached to a front surface of the gas supplying port, wherein the electrode member has a three-dimensional network structure, the method comprises the steps of: stacking a protective tape to a surface, on which a circuit pattern is formed, of a semiconductor wafer; holding the semiconductor wafer on the holding portion such that a back surface of the semiconductor wafer being upward; applying a high frequency voltage between the first electrode and the second electrode while spraying the gas for plasma generation from an irregular path constituted by a clearance of the three-dimensional network structure, thereby generating a plasma; and etching the semiconductor wafer held in the first electrode by the generated plasma.

According to the invention, the electrode member having the three-dimensional network structure of which clearance constitutes a plurality of irregular paths for causing the gas for plasma generation to pass therethrough is used as the electrode member to be attached to the front surface of the gas supplying port of the electrode for plasma generation. Consequently, the gas to be supplied by the rectifying function of the irregular paths can be distributed uniformly to prevent an abnormal discharge, thereby carrying out uniform etching having no variation. The rectifying function means that the gas supplied and passed in the irregular paths are made uniform in its injection pressure entire surface of the electrode member, while the injection directions in the irregular paths are influenced to be an even flow entire surface of the electrode member. Moreover, the three-dimensional network structure is provided so that a sufficient durability can be obtained also in a place to be exposed directly by plasma, that is, a place to be exposed by a great thermal shock.

DETAILED DESCRIPTION OF THE INVENTION

Next, an embodiment of the invention will be described with reference to the drawings.

Figure 1:
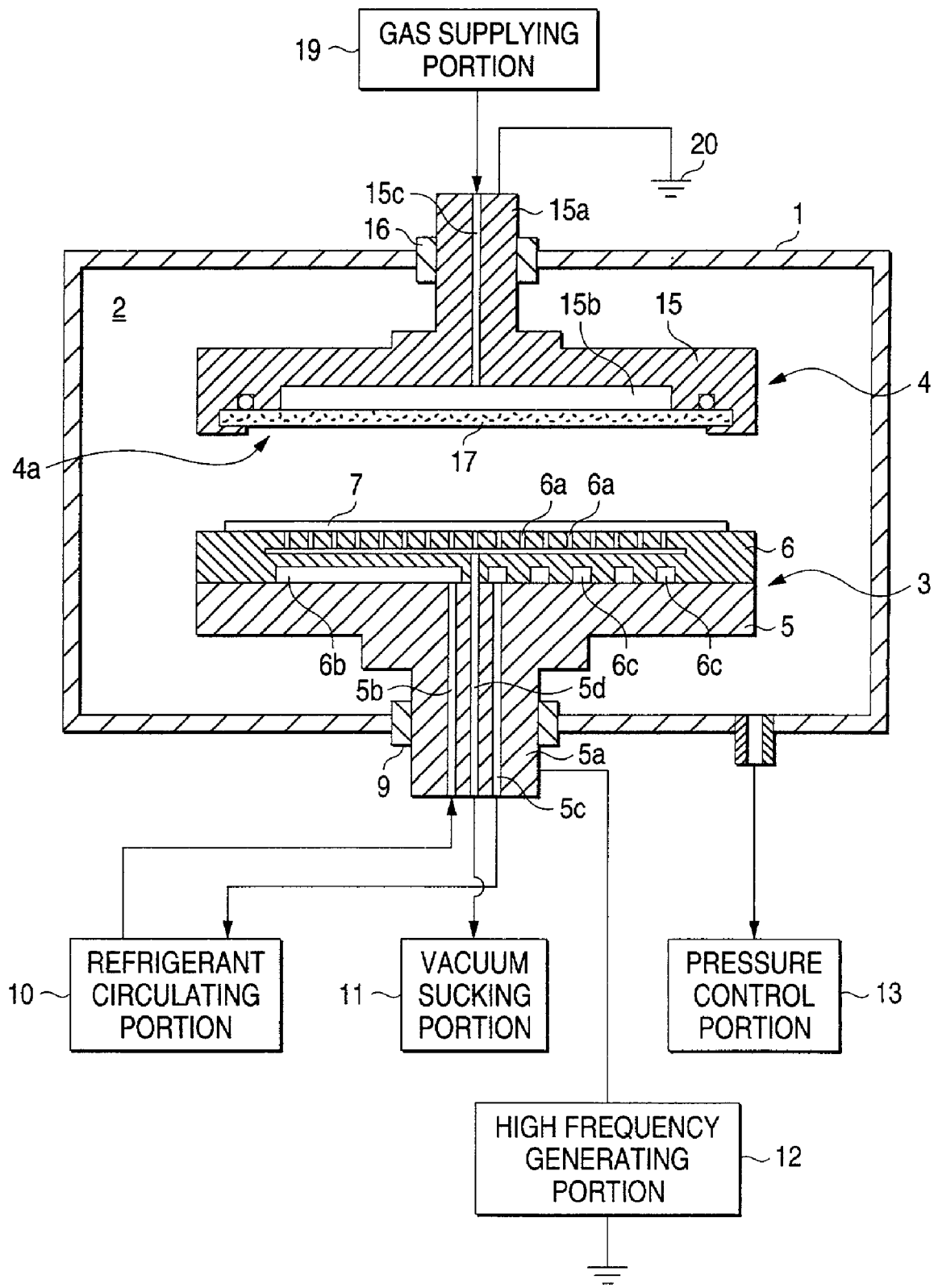
FIG. 1 is a sectional view showing a plasma treating apparatus according to an embodiment of the invention.

First of all, the plasma treating apparatus will be described with reference to FIG. 1. In FIG. 1, inside of a vacuum chamber 1 is a treatment chamber 2 for carrying out a plasma treatment. A lower electrode 3 (a first electrode) and an upper electrode 4 (a second electrode) are vertically opposed to each other in the treatment chamber 2. The lower electrode 3 includes an electrode body 5 attached to the vacuum chamber 1 through an insulator 9 made of polytetrafluorethylene by a support portion 5a extended downward. A holding portion 6 formed of a high thermal conductive material, e.g. aluminum, stainless steel or other suitable material, is attached to the upper surface of the electrode body 5, and a silicon wafer 7 (a silicon based substrate) provided with a circuit pattern is mounted on the upper surface of the holding portion 6. The vacuum chamber 1 and the electrode body 5 are formed of aluminum, stainless steel, or other suitable material. The holding portion 6 is formed with a ceramic coating on a surface of aluminum, stainless steel, or other suitable material.

The silicon wafer 7 is set in a state obtained immediately after the back side of a circuit pattern formation surface is thinned by mechanical polishing or grinding, and a damage layer including a micro-crack is formed on a polished surface. A protective tape 7a (see FIG. 5) is stuck to the circuit pattern formation surface of the silicon wafer 7 and is placed in contact with the holding portion 6. The polished surface (the back side of the circuit formation surface) to be treated is turned upward. The damaged layer of the polished surface is removed (etched) by the plasma treatment.

A large number of suction holes 6a opened to an upper surface are provided in the holding portion 6, and communicate with a sucking path 5d extending through the support portion 5a of the electrode body 5. The sucking path 5d is connected to a vacuum sucking portion 11 and vacuum suction is carried out through the vacuum sucking portion 11 with the silicon wafer 7 mounted on the upper surface of the holding portion 6 so that the silicon wafer 7 is held in the holding portion 6 by vacuum sucking.

Refrigerant passages 6b and 6c for cooling are provided in the holding portion 6 and communicate with ducts 5b and 5c extending through the support portion 5a. The ducts 5b and 5c are connected to a refrigerant circulating portion 10. By driving the refrigerant circulating portion 10, a refrigerant such as cooling water is circulated in the refrigerant passages 6b and 6c. Consequently, the holding portion 6 heated by heat generated during the plasma treatment is cooled.

The electrode body 5 is electrically connected to a high frequency generating portion 12 and the high frequency generating portion 12 applies a high frequency voltage between the lower electrode 3 and the upper electrode 4. Moreover, the treatment chamber 2 in the vacuum chamber 1 is connected to a pressure control portion 13. The pressure control portion 13 carries out a pressure reduction in the treatment chamber 2 and atmospheric opening at a vacuum breakdown in the treatment chamber 2.

The upper electrode 4 is provided in an opposite position to the lower electrode 3 and includes an electrode body 15, which is made of aluminum, stainless steel or other suitable material, grounded to a grounding portion 20. The electrode body 15 is attached to the vacuum chamber 1 through an insulator 16 made of polytetrafluorethylene by a support 15a extended upward. The electrode body 15 is an electrode for plasma generation and for supplying a gas for plasma generation to the treatment chamber 2, and has a lower surface provided with a gas supplying port 15b communicating with a gas supplying path 15c extending through the support portion 15a. The gas supplying path 15c is connected to a gas supplying portion 19 that supplies, as the gas for plasma generation, a gas mixture containing a fluorine-based gas, such as carbon tetrafluoride ($CF_4$) or sulfur hexafluoride ($SF_6$)

Figure 2A:
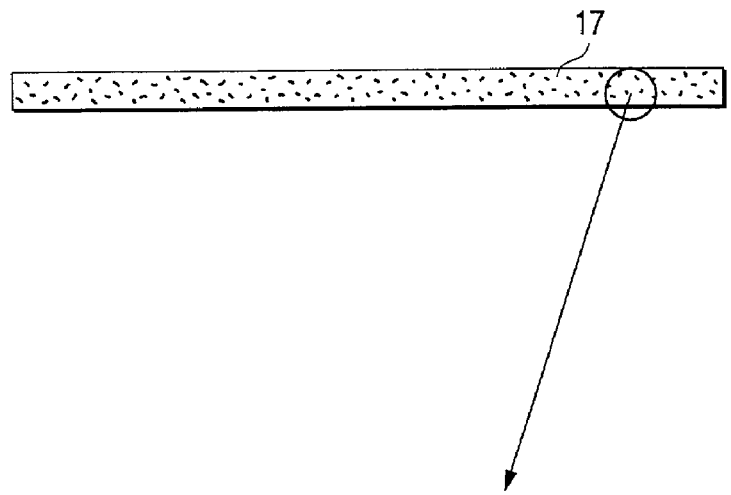
FIG. 2A is a sectional view showing an electrode member according to the embodiment of the invention.
Figure 2B:
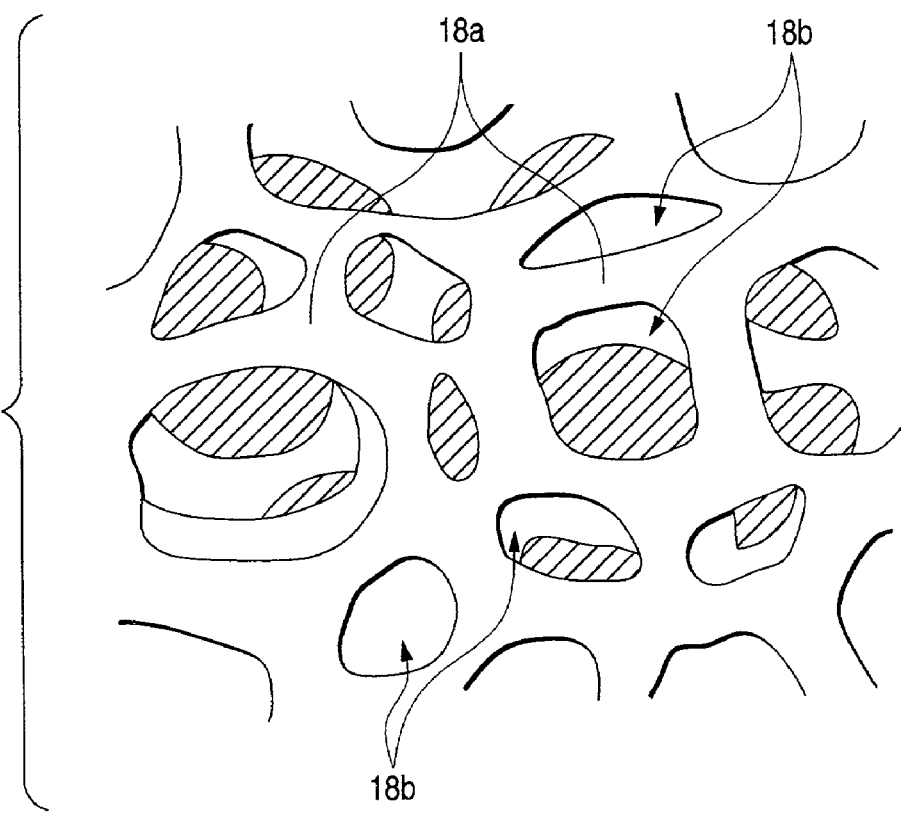
FIG. 2B is an enlarged sectional view showing the electrode member of FIG. 2A.

An electrode member 17 is attached to the front surface of the gas supplying port 15b. The electrode member 17 is a disc-shaped member comprising a ceramic porous substance. As shown in FIG. 2, the ceramic porous substance has a three-dimensional network structure in which a frame portion 18a of ceramic is formed continuously as a three-dimensional network and has a large number of hole portions 18b (clearances) therein. An average size of the hole portions 18b is about 100 μm to 300 μm in diameter. The hole portions 18b having the three-dimensional network structure constitutes a plurality of irregular paths to allow a gas to pass through the electrode member 17 from the gas supplying port 15b. The electrode member 17 has a thickness greater than 5 mm.

Figure 3:
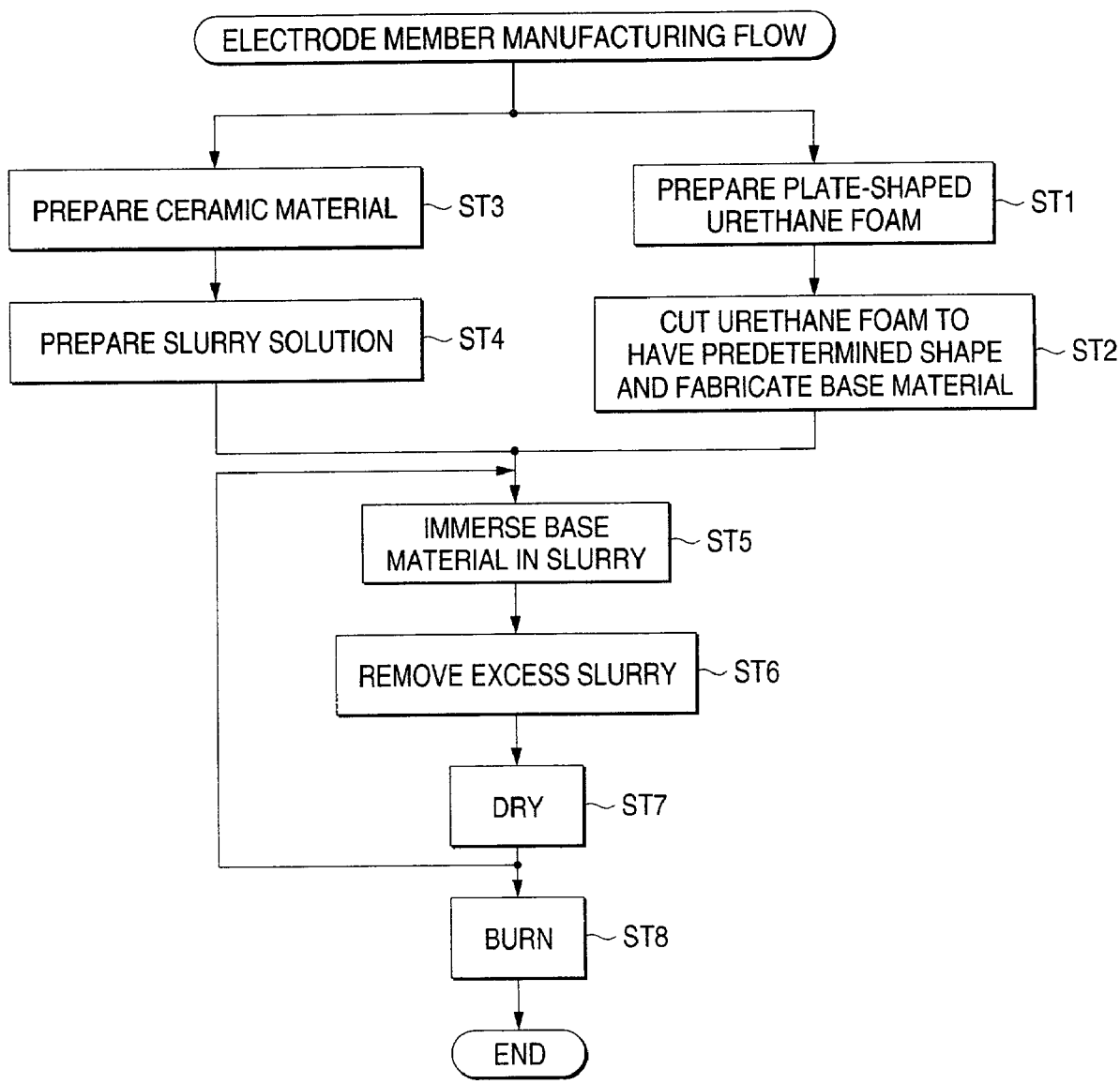
FIG. 3 is a flow chart for manufacturing the electrode member according to the embodiment of the invention.
Figure 4A:
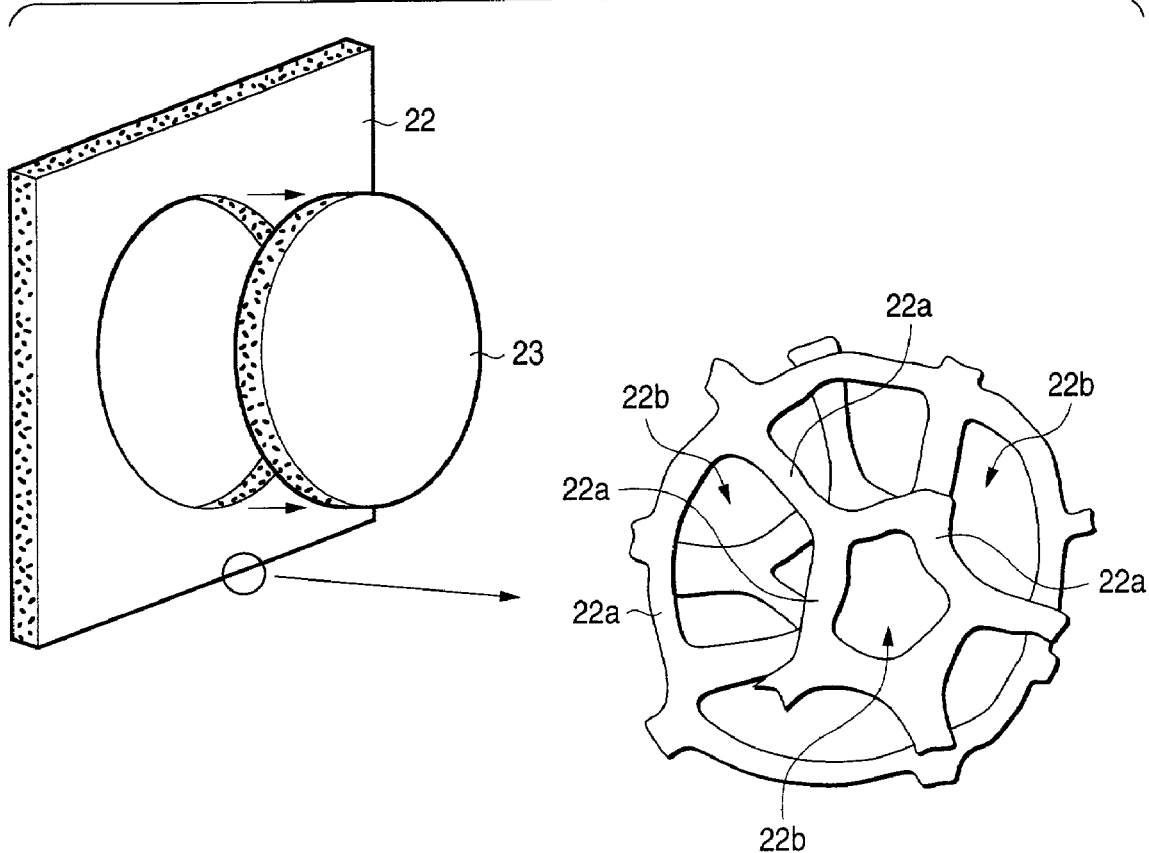
FIGS. 4A & 4B are a view illustrating a method of manufacturing the electrode member according to the embodiment of the invention.

A method of manufacturing the electrode member 17 will be described with reference to FIGS. 3 and 4. The electrode member 17 is manufactured by sticking ceramic to a polyurethane foam to be a base material. First of all, a plate-shaped urethane foam 22 is prepared (ST1), and is cut to take a predetermined shape of a disc to fabricate a base material 23 as shown in FIG. 4A (ST2). The urethane foam 22 has such a structure that a core 22a is continuously provided like a three-dimensional network and a void portion 22b is formed therein at a high porosity.

At the same time, alumina powder to be a ceramic material is prepared (ST3) and water and a surfactant for applying a fluidity to the alumina powder is added thereto, thereby forming a slurry solution 24 (ST4).

Figure 4B:
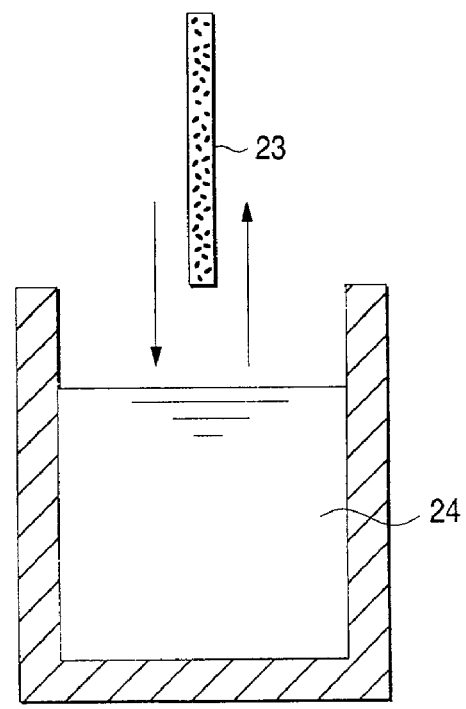

As shown in FIG. 4B, then, the base material 23 is immersed in the slurry 24 (ST5) and an excess slurry is removed from the base material 23 after pull-up (ST6). Thereafter, the base material 23 is dried to remove the water content (ST7). Subsequently, heating is carried out to cure the ceramic so that an electrode member comprising the ceramic porous substance having the three-dimensional network structure is finished (ST8) The base material 23 disappears as burnt urethane in the heating step. Therefore, an electrode member containing only the ceramic material is obtained. The steps (ST5) to (ST7) are repeatedly carried out plural times if necessary.

The electrode member 17 thus manufactured has the following characteristics. First of all, the frame portion 18a forming the hole portion 18b is molded by sticking ceramic to the periphery of the core 22a of the urethane foam 22. Therefore, it is possible to obtain a porous substance having a uniform pore size and distribution of the hole portion 18b. A mean pore size is preferably 800 µm or less in order to prevent the concentration of a plasma (an abnormal discharge). More preferably, an average of the pore size is set as 100 µm to 300 µm.

In the electrode member 17 comprising the ceramic porous substance according to the embodiment, a porosity is mainly determined by the array density of the core 22a in the urethane foam 22 to be used as a base material. Accordingly, it is possible to stick ceramic having fine crystal grains to the periphery of the core 22a and to sinter the ceramic at a high temperature, thereby forming the frame portion 18a constituted by a fine ceramic sintered substance having a high strength, a heat resistance and a heat shock resistance. Grain size of ceramic powder used in the invention is about 0.5 µm to 2.0 µm.

The electrode member 17 comprising a ceramic porous substance thus manufactured is formed by continuously providing, like the three-dimensional network, the frame portion 18a having such a structure that the fine crystal of alumina is bonded at a high density. Therefore, a heat resistance and a heat shock resistance are excellent. More specifically, even if the electrode member 17 is used in a severe place to be directly exposed to a plasma in the plasma treating apparatus, the frame portion 18a having the mutual crystal grains bonded strongly is continuously formed with a three-dimensionally isotropic structure. Therefore, a crack or a breakdown is not generated by a thermal shock. Accordingly, a sufficient durability can be obtained also in a place to be directly exposed to the plasma.

In general, moreover, ceramic having a high strength is hard to mechanically work and is formed into a component having an optional shape with difficulty. However, the electrode member 17 can be formed to have a desirable shape very easily by previously cutting the urethane foam 22 into a predetermined shape.

Figure 5:
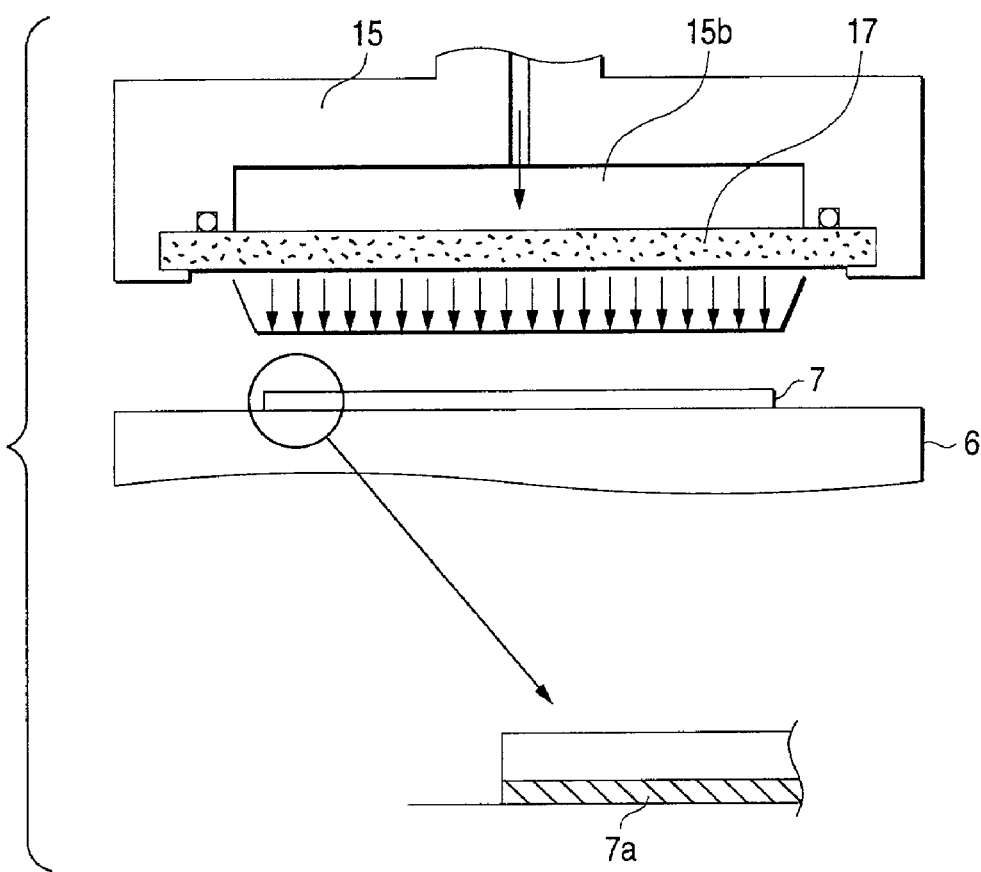
FIG. 5 is a view showing the gas flow distribution of the plasma treating apparatus according to the embodiment of the invention.

The plasma treating apparatus is constituted as described above, and the plasma treatment (etching) to be carried out for the silicon wafer 7 will be described below with reference to FIG. 5. First of all, the silicon wafer 7 is mounted on the holding portion 6 with the protective tape 7a turned downward. A pressure reduction is carried out in the treatment chamber 2 by the pressure control portion 13 (FIG. 1), and the gas supplying portion 19 is then driven. Therefore, a gas is injected downward from the electrode member 17 attached to the upper electrode 4.

Description will be given to a gas flow distribution at this time. The gas supplied from the gas supplying portion 19 can be prevented from freely flowing in the gas supplying port 15b by means of the electrode member 17. Consequently, the gas temporarily stays in the gas supplying port 15b so that a distribution in the pressure of the gas becomes almost uniform therein.

By the pressure, the gas reaches the lower surface of the electrode member 17 from the gas supplying port 15b through the hole portions 18b (FIG. 2) of the ceramic porous substance constituting the electrode member 17 and is sprayed toward the surface of the silicon wafer 7 which is provided thereunder. At this time, a large number of hole portions 18b are formed in an irregular arrangement in the electrode member 17. Therefore, the distribution of the flow of the gas to be sprayed downward from the lower surface of the electrode member 17 becomes uniform without a deviation over almost the whole range of the gas supplying port 15b.

In this state, the high frequency generating portion 12 is driven to apply a high frequency voltage to the electrode body 5 of the lower electrode 3. Consequently, a plasma discharge is generated in a space formed between the upper electrode 4 and the lower electrode 3. A plasma etching treatment is carried out over the upper surface of the silicon wafer 7 mounted on the holding portion 6 through the plasma generated by the plasma discharge. In this embodiment, when a damaged layer including a microcrack is etched, an etching rate of 2 µm/min can be obtained. According to the present invention, an etching rate higher than 1 µm/min is obtained.

In the plasma etching treatment, the distribution of the flow of the gas to be sprayed onto the surface of the silicon wafer 7 is made uniform over the whole range by means of the electrode member 17 having a rectifying function. Therefore, it is possible to prevent an abnormal discharge from being generated due to the concentration of the plasma discharge over such a range that the gas partially has a high density.

Moreover, the electrode member 17 according to the embodiment includes the frame portion 18a having mutual crystal grains bonded strongly which is continuously provided with the three-dimensionally isotropic structure (the three-dimensional network structure). Even if the electrode member 17 is used in a severe place to be directly exposed to plasma, a crack or a breakdown is not generated by thermal shock. Accordingly, if a rectifying plate for making the distribution of the gas flow uniform is to be provided in the gas supplying port, it is conventionally necessary to provide the rectifying plate separately from the discharge electrode plate to be exposed to the plasma. In the embodiment, however, the same electrode member 17 can function as the discharge electrode plate and the rectifying plate.

In the embodiment, as described above, it is possible to carry out various changes. For example, while the alumina has been taken as an example of the material of the electrode member 17, it is also possible to use alumina based ceramics and aluminum based ceramics in addition to the alumina. In this case, it is important to select a material which is hard to react with the gas to be used for generating the plasma, such as ceramics, which have an excellent corrosion resistance. Further, borosilicate glass, which is an alkaline rare earth metal, also can be used as a material of the electrode member. For a fluorine gas to be used in the embodiment, it is preferable to use metal fluoride having a high boiling point and a low vapor pressure in vacuum which is represented by oxide, nitride and carbide containing alkaline earth metal in addition to the alumina based gas.

Furthermore, while there has been described the example in which an urethane foam structure is utilized for the three-dimensional network structure, the three-dimensional network structure (the three-dimensional network structure) of a fabric, a linear fiber or metal may be used in place of the urethane foam 22.

For the method of manufacturing the electrode member 17 having the three-dimensional network structure, moreover, it is also possible to use a method of mixing and sintering fine particles of ceramic and beads-shaped resin particles. In this case, the resin particles are burnt by heat during the sintering, and a space formed by the burning becomes an irregular path and a residual structure becomes the frame portion 18*a* constituting the three-dimensional network structure.

While the example in which the silicon wafer 7 for the semiconductor device to be a silicon based substrate is intended for the plasma treatment has been described in the embodiment, the invention is not restricted to the silicon wafer 7. For example, a quartz plate to be used for a quartz oscillator which is intended for a material containing silicon can also be applied to the invention.

According to the invention, the electrode member having the three-dimensional network structure of which clearance constitutes the irregular paths for causing a gas for plasma generation to pass therethrough is used as the electrode member to be attached to the front surface of the gas supplying port of the electrode for plasma generation. Consequently, the distribution of the gas to be supplied can be made uniform to prevent an abnormal discharge and uniform etching having no variation can be carried out. Moreover, the three-dimensional network structure can produce a sufficient durability even in a place to be directly exposed to the plasma.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An electrode member for a plasma treating apparatus which includes a plasma generation electrode having the gas supplying port for supplying a gas for plasma generation to a treatment chamber, the electrode member to be attached to a front surface of the gas supplying port, wherein the electrode member includes a three-dimensional network structure and a clearance of the three-dimensional network structure made of frame portions constituted by a fine ceramic sintered substance formed from a ceramic powder which has a grain size of about 0.5 μm to 2.0 μm in diameter, and a plurality of irregular paths defined by clearance of the frame portions through which the gas for plasma generation is supplied, wherein an average size of the clearance is set in a range from 100 μm to 300 μm.

2. A plasma treating apparatus comprising:
a treatment chamber;
a first electrode having an electrode body, a support portion and a holding portion for holding a work in the treatment chamber;
a second electrode provided in a position opposed to the first electrode and having a gas supplying port for supplying a gas for plasma generation to the treatment chamber;
a pressure control portion for reducing a pressure in the treatment chamber;
a gas supplying portion for supplying the gas for plasma generation to the treatment chamber through the gas supplying port;
a high frequency generating portion for applying a high frequency voltage between the first electrode and the second electrode; and
an electrode member to be attached to a front surface of the gas supplying port,
wherein the electrode member includes a three-dimensional network structure made of frame portions constituted by a fine ceramic sintered substance formed from a ceramic powder which has a grain size of about 0.5 μm to 2.0 μm in diameter, and a plurality of irregular paths defined by clearance of the frame portions through which the gas for plasma generation is supplied,
wherein an average size of the clearance is set in a range from 100 μm to 300 μm.

3. The plasma treating apparatus according to claim 2, wherein said holding portion includes a large number of suction holes opened to an upper surface, and communicate with a sucking path penetrating through the support portion of the electrode body, the sucking path connected to a vacuum sucking portion.

4. The plasma treating apparatus according to claim 2, wherein said holding portion includes refrigerant passages for cooling, which are connected to a refrigerant circulating portion.

5. The plasma treating apparatus according to claim 2, wherein a material forming the three-dimensional network structure contains alumina.

6. The plasma treating apparatus according to claim 2, wherein the work is a silicon based substrate.

7. The plasma treating apparatus according to claim 2, wherein the work is a silicon based substrate having a damage layer formed by mechanical polishing or grinding and the damage layer is removed by plasma etching.

8. The plasma treating apparatus according to claim 2, wherein the work is a semiconductor wafer having a circuit pattern formed on a surface side and a damage layer provided on a back side of the semiconductor wafer is removed by plasma etching.

* * * * *